(12) United States Patent
Chen et al.

(10) Patent No.: US 7,259,444 B1
(45) Date of Patent: Aug. 21, 2007

(54) OPTOELECTRONIC DEVICE WITH PATTERNED ION IMPLANT SUBCOLLECTOR

(75) Inventors: Mary Y. Chen, Oak Park, CA (US); Donald A. Hitko, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 74 days.

(21) Appl. No.: 10/895,517

(22) Filed: Jul. 20, 2004

(51) Int. Cl.
*H01L 31/075* (2006.01)
*H01L 31/105* (2006.01)
*H01L 31/117* (2006.01)
*H01L 31/119* (2006.01)

(52) U.S. Cl. .................... 257/656; 257/10; 257/227; 257/292; 257/458

(58) Field of Classification Search ............... 257/292, 257/458, 656, 10, 227
See application file for complete search history.

(56) References Cited

U.S. PATENT DOCUMENTS

| | | | |
|---|---|---|---|
| 5,098,853 A | | 3/1992 | Clark et al. |
| 5,159,423 A | | 10/1992 | Clark et al. |
| 5,168,071 A | | 12/1992 | Fullowan et al. |
| 5,298,438 A | | 3/1994 | Hill |
| 5,365,101 A | * | 11/1994 | Tonai .................... 257/434 |
| 5,391,910 A | * | 2/1995 | Fujimura et al. ............ 257/458 |
| 5,410,175 A | * | 4/1995 | Kyomasu et al. ............ 257/458 |
| 5,412,229 A | * | 5/1995 | Kuhara et al. .............. 257/183 |
| 5,412,249 A | * | 5/1995 | Hyugaji et al. ............. 257/745 |
| 5,557,117 A | * | 9/1996 | Matsuoka et al. ........... 257/184 |
| 5,606,572 A | * | 2/1997 | Swirhun et al. ............. 372/96 |
| 5,665,614 A | | 9/1997 | Hafizi et al. |
| 5,672,522 A | | 9/1997 | Streit et al. |
| 5,729,033 A | | 3/1998 | Hafizi |
| 5,793,790 A | * | 8/1998 | Doi et al. .................. 372/50.1 |
| 6,005,266 A | * | 12/1999 | Forrest et al. .............. 257/258 |
| 6,027,956 A | * | 2/2000 | Irissou ..................... 438/68 |
| 6,184,054 B1 | * | 2/2001 | Tsay ...................... 438/57 |
| 2002/0025597 A1 | * | 2/2002 | Matsuda ................... 438/57 |

(Continued)

OTHER PUBLICATIONS

Huber, et al., InP-InGaAs Single HBT Technology for Photoreceiver OEIC's at 40 Gb/s and Beyond, Journal of Lightwave Technology, vol. 18, No. 7, pp. 992-1000, Jul. 2000.

(Continued)

*Primary Examiner*—Ida M. Soward
(74) *Attorney, Agent, or Firm*—Christopher R. Batzan, Esq.

(57) ABSTRACT

In one embodiment, an optoelectronic device is provided having a pin photo diode including a semi-insulating substrate or layer, with a patterned implant region of a first dopant type. The pin photo diode includes an upper layer having semiconductor material with a second dopant type. An intermediate layer is provided having a substantially intrinsic semiconductor material. An upper layer contact is provided having a portion with a generally circular interior facing edge. The implant region has a first portion having an outer periphery substantially nonoverlapping with the interior facing edge of the upper layer contact. The implant region includes a contact portion located beyond the upper layer contact. A connecting portion couples the first portion and the contact portion of the implant region. In one embodiment, the device includes a heterojunction bipolar transistor coupled to the pin photo diode. The transistor may have a patterned implant region in the semi-insulating substrate or layer comprising the first dopant type.

45 Claims, 5 Drawing Sheets

U.S. PATENT DOCUMENTS

| | | | |
|---|---|---|---|
| 2003/0164444 A1* | 9/2003 | Yoneda et al. | 250/214.1 |
| 2003/0168709 A1* | 9/2003 | Kashiura | 257/458 |
| 2004/0046182 A1 | 3/2004 | Chen et al. | |
| 2004/0108445 A1* | 6/2004 | Shiu | 250/214.1 |
| 2004/0262619 A1* | 12/2004 | Takahashi et al. | 257/79 |
| 2005/0167709 A1* | 8/2005 | Augusto | 257/292 |
| 2006/0008933 A1* | 1/2006 | Muller et al. | 438/48 |

OTHER PUBLICATIONS

Yung, et al., Highly Integrated InP HBT Optical Receivers, Journal of Solid-State Circuits, vol. 34, No. 2, pp. 219-227, Feb. 1999.

Sokolich, et al., InP HBT Integrated Circuit Technology with Selectively Implanted Subcollector and Regrown Device Layers, IEEE GaAs Digest, pp. 219-222, 2003.

Makiuchi, et al., Flip-Chip Planar GaInAs/InP p-i-n Photodiodes Analysis of Frequency Response, Journal of Lightwave Technology, vol. 14, No. 1, Jan. 1996.

Makiuchi, et al., Small -Junction-Area GaInAs/InP pin Photodiode with Monolithic Microlens, vol. 24, No. 2, pp. 109-110, 1988.

Makiuchi et al., GaInAs pin Photodioe/GaAs Preamplifier Photoreceiver for Gigabit-rate Communications Systems Using Flip-Chip Bonding Techniques, Electronics Setters, vol. 24, pp. 995-996, 1988.

Pedrotti et al., Monolithic Ultrahigh-Speed GaAs HBT Optical Integrated Receivers, GaAs IC Symposium, pp. 205-208, 1991.

Lauterbach et al., Advanced integrated planar InP/InGaAs/InP:Fe photoreceiver with slectively ion implanted p and n regions, Inst. Phys. Conf. Ser. No. 112; Chapter 8, paper presented at the Int. Symp. GaAs and Related Compounds, Jersey, 1990.

Matsuoka et al., Novel InP/InGaAs Double-Heterojunction Bipolar Transistors Suitable for High-Speed IC's and OEIC's, Conference Proceedings of the 6th International Conference on Indium Phosphide and Related Material (IPRM), pp. 555-558, (1994).

Haussler et al., Ion-implanted Planar pin Diodes in InP/GaInAs Layers Grown on Implanted InP:Fe, Electronics Letters, vol. 25, No. 17, pp. 1158-1159, Aug. 1989.

* cited by examiner

US 7,259,444 B1

OPTOELECTRONIC DEVICE WITH PATTERNED ION IMPLANT SUBCOLLECTOR

ORIGIN OF INVENTION

The U.S. Government has a paid-up license in this invention and the right in limited circumstances to require the patent owner to license others on reasonable terms as provided for the terms of contract number TFAST AFRL F33615-02-C-11268 awarded by DARPA.

BACKGROUND

FIG. 1 shows a cross sectional view of a simplified illustration of one example of a conventional pin photo diode 100. The pin photo diode 100 is capable of use in a optoelectric integrated circuit or OEIC (not shown). The OEIC may further include other devices such as a heterojunction bipolar transistor or HBT (not shown), for example.

The pin photo diode 100 is formed on a substrate 110, which may be for example InP. On the substrate 110 is an isolation mesa 120 may be doped with n+ dopant to form a subcollector. Formations of the isolation mesa 120 functions to electrically isolate the photo diode from adjacent devices (not shown) on the OEIC (not shown). To provide electrical connection, collector metal 130 is located on the isolation mesa 120. An intrinsic or lightly doped n− layer 140 is located between the isolation mesa 120 and a base layer 150, which may be doped with p+ dopant. A ring, or partial ring, of base metal 160 provides an opening for light to pass through to the intrinsic layer 140, and provides electrical connection with the base layer 150.

The isolation mesa 120 typically includes n+ type dopant in a semiconductor material, while the base includes a p+ type dopant in semiconductor material. The p type-intrinsic-n type or p-i-n configuration may be fabricated using masking and etching techniques known in the art.

With pin photo diodes 100, as with HBT transistors, base-to-collector capacitance limits the bandwidth of a device. A trade-off exists between series resistance and capacitance of the device. For low series resistance you need a large collector contact 130 and a large base contact 160. A large subcollector (isolation mesa 120)-to-base 150 overlap, however, increases the capacitance of the device. Ideally a low RC time constant is desired. This is particularly desirable in high performance devices operating at high frequency. Thus, what is needed is a device with low capacitance and low resistance.

SUMMARY

In one embodiment, an optoelectronic device is provided which has a pin photo diode including a semi-insulating substrate or layer having a patterned implant region of a first dopant type. For example, the semi-insulating substrate or layer may be indium phosphide and the first dopant type may be n+. The pin photo diode includes an upper layer having semiconductor material with a second dopant type. For example, the second dopant type may be p+. An intermediate layer having a substantially intrinsic semiconductor material is located between the implant region and the upper layer.

An upper layer contact having a portion with a generally circular interior facing edge. The patterned implant region has a first portion having an outer periphery substantially nonoverlapping with the interior facing edge of the upper layer contact. The patterned implant region includes a contact portion located beyond the upper layer contact. A connecting portion couples the first portion and the contact portion of the patterned implant region.

In one embodiment, the optoelectronic device includes a transistor coupled to the pin photo diode, such as a heterojunction bipolar transistor. The transistor has a patterned implant region of the first dopant type in the semi-insulating substrate or layer.

BRIEF DESCRIPTION OF THE DRAWINGS

The features and advantages of the present invention will be better understood with regard to the following description, appended claims, and accompanying drawings where:

DESCRIPTION

Figure 2:
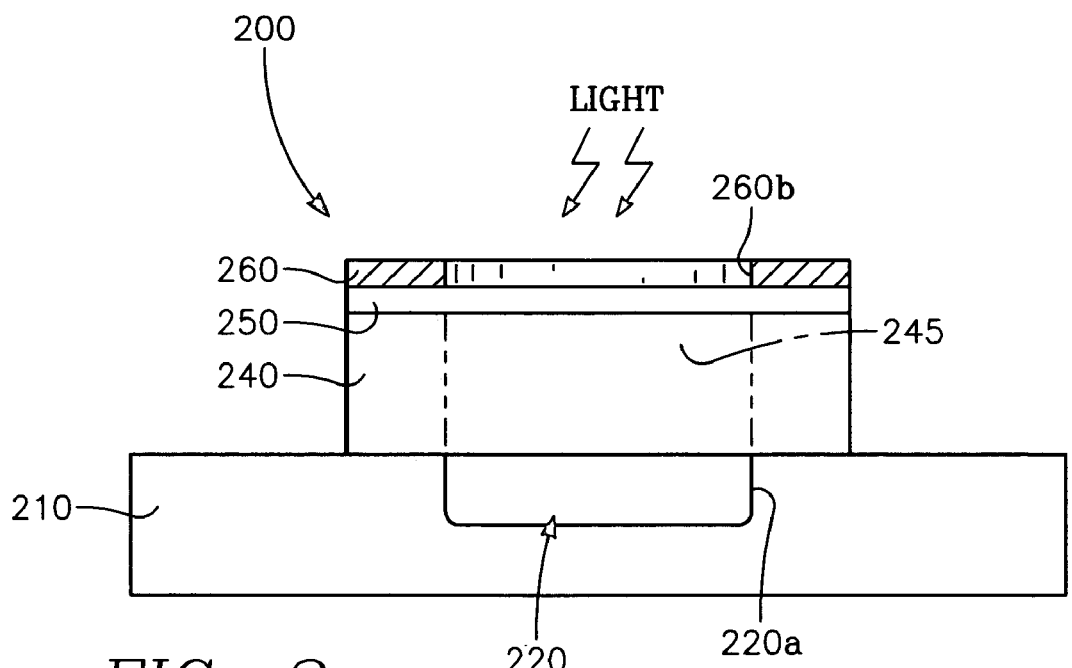
FIG. 2 is a simplified illustration of a cross sectional view, along the 2-2 line of FIG. 4, of a pin photo diode in accordance with one embodiment of the present invention.
Figure 4:
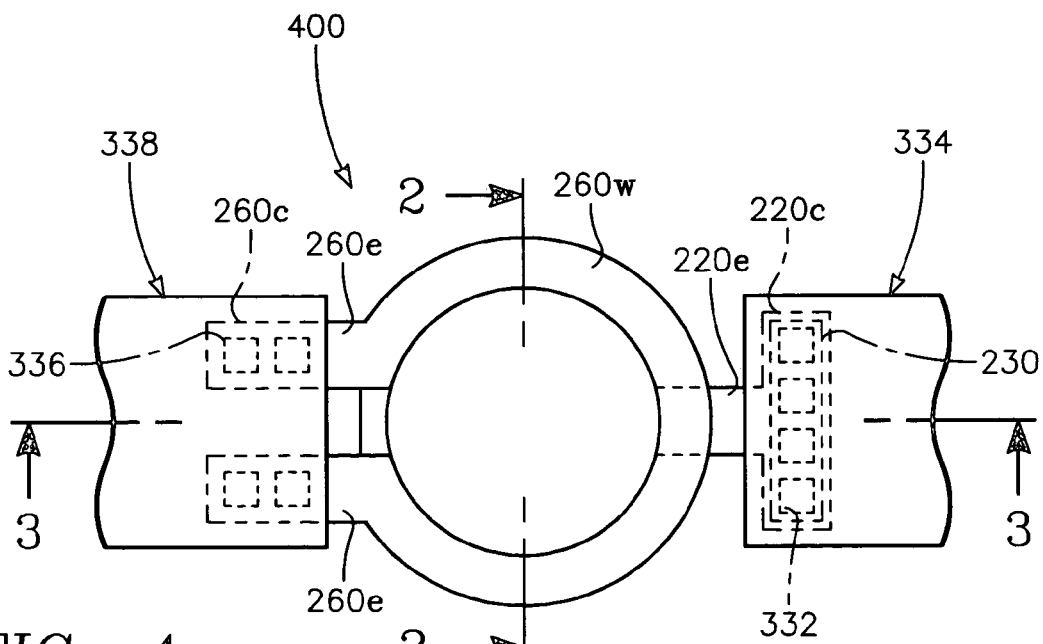
FIG. 4 shows a top view of a pin photo diode in accordance with one embodiment of the present invention.

FIG. 2 is a cross sectional view, along the 2-2 line of FIG. 4 of a simplified illustration (without collector contact 230, vias 336 and interconnect metal 338 shown in FIG. 4) of a pin photo diode 200 in accordance with one embodiment of the present invention. An n+ doped implant region 220 is formed in semi-insulating substrate 210 or in a semi-insulating layer over a substrate, for example in a semi-insulating InP substrate or semi-insulating InP layer above a substrate.

The implant region 220 may be formed with a patterned ion implant, followed by an activation process, such as a rapid thermal anneal activation, CVD chamber annealing, or other known activation techniques for forming a patterned doped region. Various ion implant species may be utilized such as, for example, Si, Si/Se, or Si/P can be used for n-type implant. Dopant concentrations after activation/annealing may be on the order of about $10^{18}/cm^3$ to about $10^{19}/cm^3$, for example. Other known ion implant and co-implant species, and concentrations, are possible.

An intrinsic layer 240 is positioned over the implant region 220. The intrinsic layer 240 may include or be a lightly doped n− layer in some embodiments. In this embodiment, in addition to a portion of the intrinsic layer 240 being located on the implant region 220, a portion of the intrinsic layer 240 is located directly on the semi-insulating layer or substrate 210. A p+ base layer 250 with an overlying base metal 260 is located over the intrinsic layer 240.

Figure 4A:
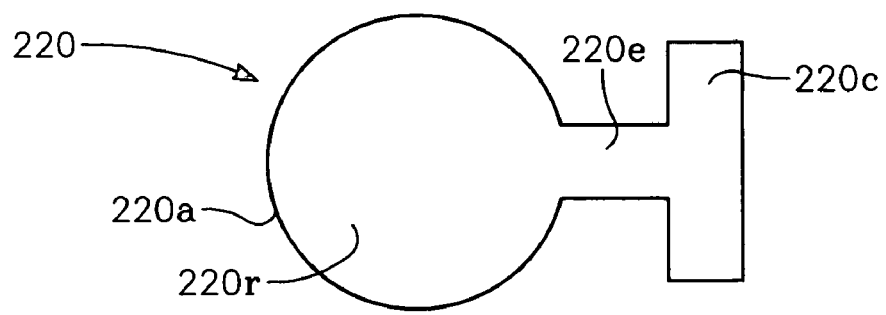
FIG. 4A shows a top view of the implant region of the pin photo diode of FIG. 4.

Referring to FIGS. 2 and 4A, to limit extrinsic base-to-collector capacitance, the implant region 220, shown in top view in FIG. 4A, has a circular portion 220r which is sized and positioned so that the periphery of the circular portion 220a, does not extend beyond the base metal layer 260. In some embodiments, as illustrated in FIG. 2, the periphery 220a does not extend beyond the interior facing sidewall 260b of the base metal 260.

Because light does not penetrate the base metal 260, the active region 245 (shown within phantom lines) of the pin photo diode 200 is located primarily under the area inside of the base metal 260, i.e. below a central LIGHT opening defined by the interior facing sidewall 260b. Unlike the isolated mesa 120 of FIG. 1, which extends substantially beyond the periphery of the base layer 150, the periphery 220a of the circular portion 220r of the implant region 220 does not extend beyond the inner periphery of the base metal 260 in the embodiment of FIG. 2. This size limitation provides reduced capacitance between the implant region 220 (subcollector) and the base layer 250.

Figure 3:
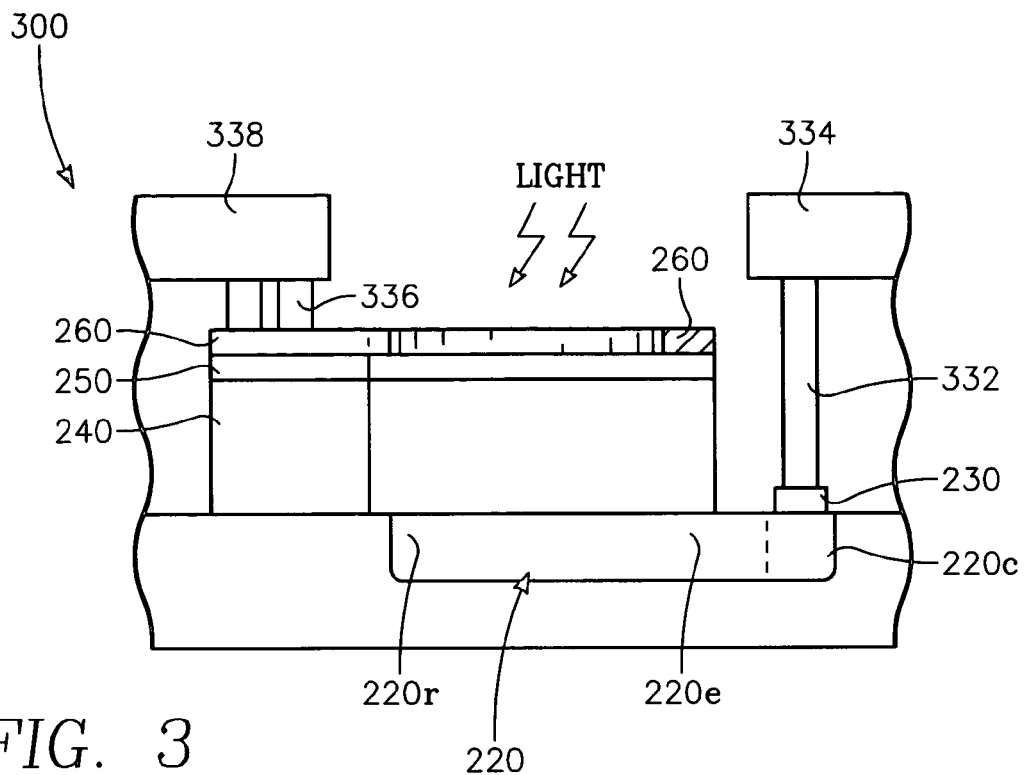
FIG. 3 shows a cross sectional view, along the 3-3 line of FIG. 4, of a pin photo diode in accordance with one embodiment of the present invention.

FIG. 3 shows a cross sectional view along the 3-3 line of FIG. 4 of a pin photo diode 300 in accordance with one embodiment of the present invention. As shown in FIGS. 3 and 4A, a contact portion 220c of the implant region 220 is located beyond the base metal 260. An elongated strip portion 220e extends in a radial direction between the circular portion 220r and the contact portion 220c of the region 220. A collector contact 230 is on the contact portion 220c of the implant region 220.

Figure 4B:
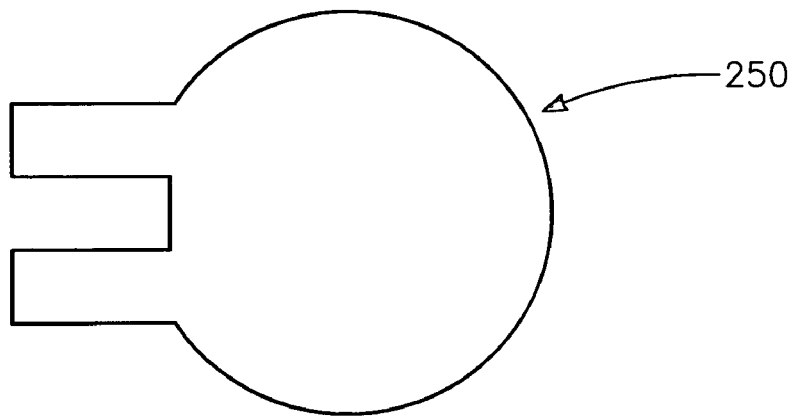
FIG. 4B shows a top view of the base layer of the pin photo diode FIG. 4.
Figure 4C:
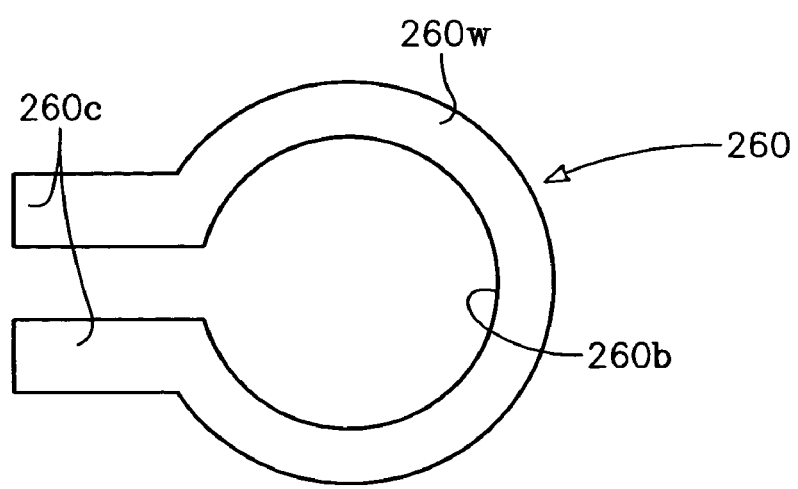
FIG. 4C shows a top view of the base metal of the pin photo diode FIG. 4.

Referring to FIGS. 4, 4B, and 4C, the base metal layer 260 has an annular portion 260w. Contact regions 260c, which are distanced from the annular portion 260w, allow vias 336 to contact the interconnect metal 338. The base metal layer 260 is overlying the base layer 250. FIG. 4B shows a top view of the base layer 250.

In the embodiment of FIG. 4, only the elongated portion 220e of the subcollector implant region 220 passes under the base metal 260. This provides a significantly reduced subcollector area extending under the base layer as compared to pin photo diodes having an isolated mesa subcollector area. This reduction of subcollector area is achieved by reducing the area under the base metal 260 near an optically inactive region of the photo diode. The inactive region occurs due to shading of the light by the base metal 260. The n+ implant region is substantially confined to directly below the active region 245, so there is no longer a significant amount of carriers in non-active region. As a result, the electric field is able to penetrate all the way through the substrate reducing the capacitance in the non-active region. The reduction in capacitance becomes more significant as a percentage of the total base-to-collector parasitic capacitance $C_{bc}$ as photo diode size is reduced.

As a result of the reduced parasitic capacitance, the active device area of the photo diode can be designed larger to facilitate fiber alignment tasks. This is because the diameter of the active device area has to be greater than the beamwidth to avert signal loss. Thus, some embodiments will allow more available light which can enhance responsivity.

Furthermore, referring to FIGS. 3 and 4, because the contact portion 260c is not opposing the base layer 250 it may be constructed large enough to accommodate a low resistance interconnection with the vias 336. As such, with some embodiments it is possible able to reduce the base-to-collector capacitance $C_{bc}$ without a significant increase in base resistance.

Figure 1:
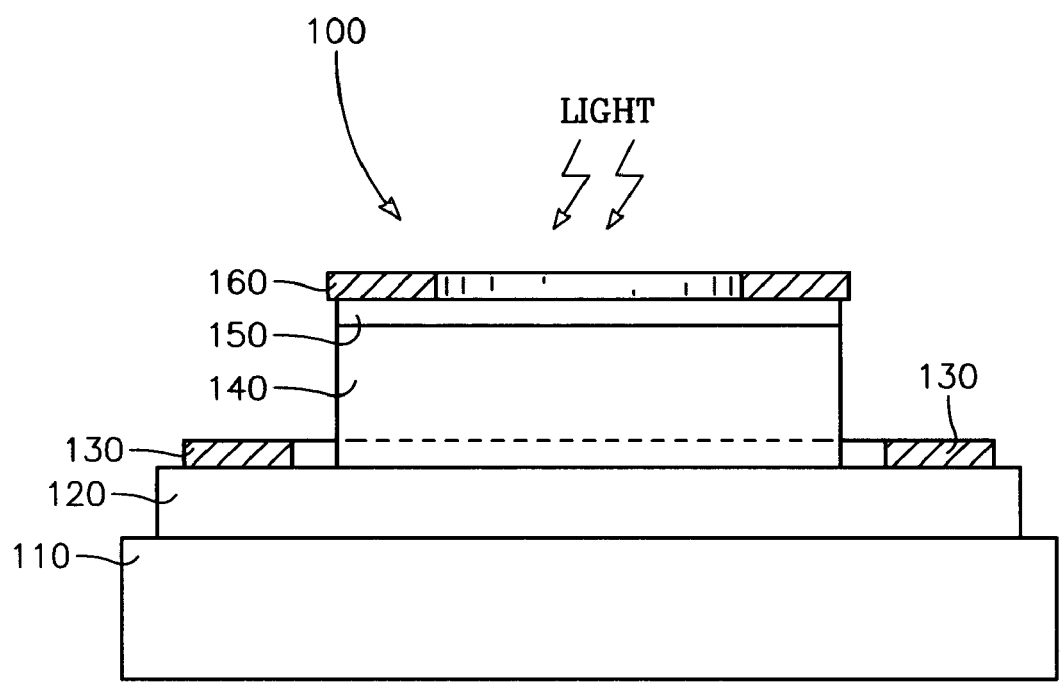
FIG. 1 shows a cross sectional view of a simplified illustration of a conventional pin photo diode.

With conventional photo diodes, shown in FIG. 1, base-to-collector capacitance $C_{bc}$ is tied to base resistance $R_s$. Base-to-collector capacitance $C_{bc}$ typically is reduced by reducing the size of the base metal ring, by either reducing the annular width of the base metal ring, or reducing the circular length of the base metal ring. As base-to-collector capacitance $C_{bc}$ decreases, base resistance $R_s$ increases, proportionally. Some embodiments of the present invention, however, allow the base-to-collector capacitance $C_{bc}$ to be decreased without a concomitant increase in base resistance $R_s$. Also, in certain embodiments of the present invention, the width of the annular portion 260w of the base metal ring may be increased without proportionately increasing $C_{bc}$. Thus, it allows base resistance $R_s$ to be decreased without a concomitant increase in base-to-collector capacitance $C_{bc}$.

Figure 5:
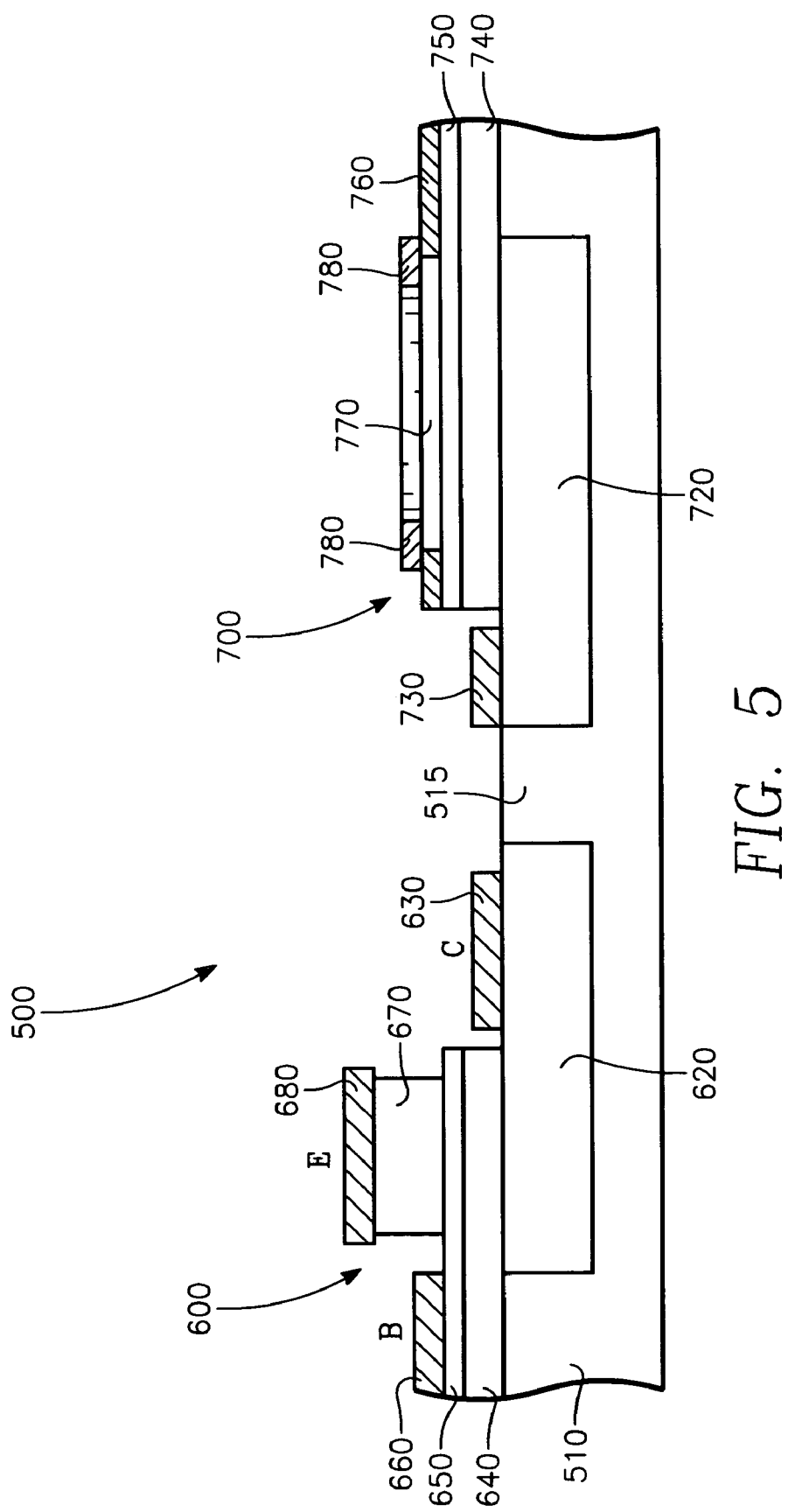
FIG. 5 is a simplified diagram of an optoelectric integrated circuit shown in cross sectional side view in accordance with one embodiment of the present invention.

FIG. 5 is a simplified diagram optoelectric integrated circuit or OEIC 500 shown in cross sectional side view in accordance with one embodiment of the present invention. This embodiment, a pin photo diode 700 and a heterojunction bipolar transistor or HBT 600 are located on the same substrate 510. The pin photo diode 700, similar to those discussed above, includes an activated n+ implant region 720 within a semi-insulating substrate 510, a lightly doped or intrinsic layer 740 located over the implant region 720, and a p+ base layer 750 with an overlying base metal 760.

This embodiment shows an n− passivation layer 770 shorted to the adjacent underlying p+ base layer by a conductor ring portion 780, which connects the n− passivation layer 770 to the base metal conductor ring portion 760. A similar passivation layer 770 may be included in the above discussed embodiments. The passivation layer 770 inhibits surface current. An optically non-active material may be utilized, such as for example InAlAs, InP, ect.

The HBT 600 may be located adjacent the pin photo diode 700. As with the pin photo diode 700, a patterned n+ implant region 620 is formed in the substrate 510. An intrinsic layer 640 and a base layer 650 are located between the n+ subcollector implant region 620 and an emitter layer 670. A collector metal 630 is located on the n+ implant region 620, a base metal 660 is located on the extrinsic base layer 650, and emitter metal 680 is located on the emitter layer 670. Additionally, a portion of the extrinsic base layer 650 extends over the semi-insulating substrate 510. With the OEIC embodiment, many of the corresponding layers/structures of the pin photo diode 700 and the HBT 600 may be fabricated during the same process steps. Thus, the intrinsic layer 740 (absorption layer of the pin diode 700) and the intrinsic layer 640 (collector of the HBT 600) may be formed from the same deposition layer(s), with the same thickness, for example about 300 nm to about 400 nm in thickness of intrinsic or lightly doped n− material. It is important to note that intrinsic layers may be formed of intrinsic material or of lightly doped material, or may be formed of several layers of intrinsic material and/or lightly doped material.

In certain embodiments with the semi-insulating substrate 510, such as InP, or other semi-insulating, or insulating, substrates capable of patterned implantation, electrical isolation is present in the region 515 between the patterned implant region structures 620 and 720.

In OEIC receivers, small sized photo detectors are often required due to their lower capacitance. The patterned implant may be performed prior to building the rest of the structures of the pin photo diode. As such, surface topology will not constrain buried n+ region tolerances as it sometimes does with traditional structures, which are sometimes fabricated with top down fabrication approaches. Thus, the patterned implant regions may be fabricated to extremely precise/small tolerances and sizes in order to limit capacitance and improve performance. Furthermore, the above described structures are more robust because they are formed on a buried n+ layer and adjacent substrate material. This reduces stack height and can reduce structural overhang of a collector, or a sub-collector. This improves processing yields and uniformity. Moreover, it can improve the thermal properties of the device.

Although the layers 640, 650, 670, 740, 750, and 770 are illustrated as single layers, they may each include multiple sub-layers as is well known in the art. An example of a device having multiple sub-layers is illustrated by D. Huber et al., in "InP-InGaAs Single HBT Technology for Photoreceiver OEIC's at 40 Gb/s and Beyond", Journal of Lightwave Technology, Vol. 18, No. 7, pp. 992-1000, July 2000, herein incorporated by reference.

Figure 6:
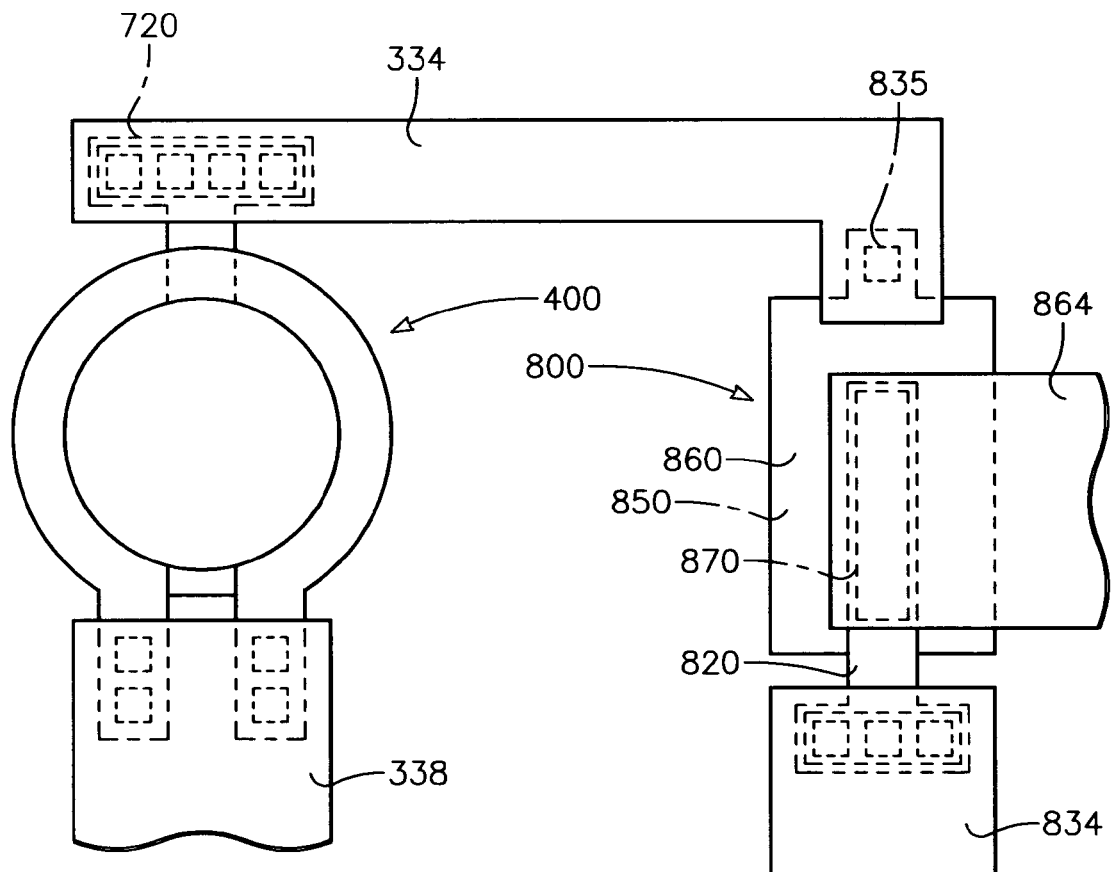
FIG. 6 is a top view of a possible optoelectric integrated circuit in accordance with one embodiment of the present invention.

FIG. 6 is a top view of a possible optoelectric integrated circuit in accordance with one embodiment of the present invention. A pin photo diode 400, as discussed above, is coupled to an HBT 800. The interconnect metal 334 is coupled between the subcollector 720 of the pin photo diode 400 and the base 850 of the HBT 800 through via 835 and base metal 860. The base 850 and base metal 860 is located between emitter 870 and n+ implant region 820. The collector interconnect metal is provided at 834.

Furthermore, the HBT devices discussed above may be single-heterojunction bipolar transistor or SHBT, or double-heterojunction bipolar transistor or DHBT as known in the art. One example of a DHBT is discussed by Matsuoka, et al., in "Novel InP/InGaAs Double-Heterojunction Bipolar Transistors Suitable for High-Speed IC's and OEIC's, Conference Proceedings of the 6th International Conference on Indium Phosphide and Related Material (1994), pp. 555-558, herein incorporated by reference. Thus, in some embodiments, the pin photo diode 700 may be fabricated simultaneously with a DHBT 600, as discussed by Matsuoka, et al.

Although the above example is illustrated with respect to an HBT transistor, other variations are possible. Various embodiments of the optoelectric integrated circuit may include field effect transistors, such as heterojunction field effect transistor or HFET, junction field effect transistor or JFET, or the like, or other transistor types. One example of a photodetector-JFET device is shown in "Advanced Integrated Planar In/InGaAs/InP:Fe Photoreceiver with Selectively Ion Implanted p and n Regions," by C. Lauterbach et al., Inst. Phys. Conf., Ser. No. 112, Chapter 8, pp. 585-590, presented at Int. Symp. GaAs and Related Compounds (1980), herein incorporated by reference. In addition, other devices may be integrated and/or combined with the patterned implant pin photo diode discussed above.

Various embodiments of the present invention may include InP, InP:Fe, GaAs, InGaAs, as well as other Group III-V compounds, or the like, in the device layers and/or in the semi-insulating substrate/layer. Other semi-insulating substrates/layers are possible.

Having described this invention in connection with a number of embodiments, modification will now certainly suggest itself to those skilled in the art. As such, the invention is not to be limited to the disclosed embodiments except as required by the appended claims.

What is claimed is:

1. An optoelectronic device comprising a pin photo diode, the pin photo diode comprising:
   a) a patterned implant region within one of: (1) a semi-insulating substrate; or (2) a semi-insulating layer, the patterned implant region comprising a first dopant type;
   b) an upper layer comprising semiconductor material having a second dopant type;
   c) an intermediate layer comprising a substantially intrinsic semiconductor material between the implant region and the upper layer;
   d) an upper layer contact comprising a portion having a generally circular interior facing edge; and
   e) the patterned implant region comprising:
      (i) a first portion having an outer periphery such that the outer periphery substantially is not beyond the generally circular interior facing edge;
      (ii) a contact portion located beyond the upper layer contact; and
      (iii) a connecting portion coupling the first portion and the contact portion of the patterned implant region.

2. The optoelectronic device of claim 1 wherein the one of the semi-insulating substrate or the semi-insulating layer comprises a group III-V compound.

3. The optoelectronic device of claim 2 wherein the one of the semi-insulating substrate or the semi-insulating layer comprises GaAs.

4. The optoelectronic device of claim 2 wherein the one of the semi-insulating substrate or the semi-insulating layer comprises InP.

5. The optoelectronic device of claim 4 wherein the one of the semi-insulating substrate or the semi-insulating layer comprises InP:Fe.

6. The optoelectronic device of claim 4 wherein the first dopant type comprises at least one of the group consisting of ions of: (a) Si; (b) Si/Se; or (c) Si/P.

7. The optoelectronic device of claim 1 wherein the intermediate layer comprises a portion extending onto the one of the semi-insulating substrate or the semi-insulating layer.

8. The optoelectronic device of claim 7 wherein the upper layer comprises a portion extending over the one of the semi-insulating substrate or the semi-insulating layer.

9. The optoelectronic device of claim 1 wherein the upper layer contact comprises an annular portion, and wherein the first portion of the of patterned implant region is concentrically aligned within the annular portion.

10. The optoelectronic device of claim 1 wherein the connecting portion comprises an elongated strip coupling the first portion and the contact portion of the patterned implant region, the elongated strip extending in a radial direction between the first portion and the contact portion of the implant region.

11. The optoelectronic device of claim 1 further comprising a transistor coupled to the pin photo diode.

12. The optoelectronic device of claim 11 wherein the transistor comprises a heterojunction bipolar transistor coupled to the pin photo diode, the heterojunction bipolar transistor comprising a patterned implant region comprising the first dopant type located within the one of the semi-insulating substrate or the semi-insulating layer.

13. An optoelectronic integrated circuit comprising a pin photo diode, the pin photo diode comprising:
   a) a patterned implant region within one of: (1) a semi-insulating substrate; or (2) a semi-insulating layer, the patterned implant region comprising a first dopant type;
   b) an upper layer comprising semiconductor material having a second dopant type;
   c) an intermediate layer comprising a substantially intrinsic semiconductor material between the implant region and the upper layer;
   d) an upper layer contact having an interior facing edge; and e) the patterned implant region comprising:
  (i) first portion having a generally circular outer periphery such that the generally circular outer periphery substantially is not beyond the interior facing edge;
  (ii) a contact portion located beyond the upper layer contact; and
  (iii) a elongated strip coupling the first portion and the contact portion of the patterned implant region, the elongated strip extending in a radial direction between the first portion and the contact portion of the implant region.

14. The optoelectronic device of claim 13 wherein the intermediate layer comprises a portion extending onto the one of the semi-insulating substrate or the semi-insulating layer beyond the patterned implant region.

15. The optoelectronic device of claim 14 wherein the upper layer comprises a portion extending over the one of the semi-insulating substrate or the semi-insulating layer beyond the patterned implant region.

16. The optoelectronic device of claim 13 wherein the one of the semi-insulating substrate or the semi-insulating layer comprises a group III-V compound.

17. The optoelectronic device of claim 16 wherein the one of the semi-insulating substrate or the semi-insulating layer comprises GaAs.

18. The optoelectronic device of claim 16 wherein the one of the semi-insulating substrate or the semi-insulating layer comprises InP.

19. The optoelectronic device of claim 18 wherein the one of the semi-insulating substrate or the semi-insulating layer comprises InP:Fe.

20. The optoelectronic device of claim 13 wherein the upper layer contact comprises an annular portion, and wherein the first portion of the of patterned implant region is concentrically aligned within the annular portion.

21. The optoelectronic device of claim 13 further comprising a heterojunction bipolar transistor coupled to the pin photo diode, the heterojunction bipolar transistor comprising a patterned implant region comprising the first dopant type located within the one of the semi-insulating substrate or the semi-insulating layer.

22. An optoelectronic integrated circuit comprising:
  a) a photo diode comprising:
    (i) a patterned implant region within one of: (1) a semi-insulating substrate; or (2) a semi-insulating layer, the patterned implant region comprising a first dopant type;
    (ii) an upper layer comprising semiconductor material having a second dopant type;
    (iii) an intermediate layer comprising a substantially intrinsic semiconductor material between the implant region and the upper layer, a portion of the intermediate layer extending onto the one of the semi-insulating substrate or the semi-insulating layer;
    (iv) an upper layer contact comprising a portion having a generally circular interior facing edge; and
    (v) the patterned implant region comprising:
      (1) a first portion having a generally circular outer periphery substantially nonoverlapping with the interior facing edge of the upper layer contact;
      (2) a contact portion located beyond the upper layer contact; and
      (3) an elongated strip portion coupling the first portion and the contact portion of the patterned implant region, the elongated strip extending in a radial direction between the first portion and the contact portion of the implant region;
  b) a heterojunction bipolar transistor comprising:
    (i) a patterned implant subcollector region in the one of the semi-insulating substrate or the semi-insulating layer, the patterned implant region of the heterojunction bipolar transistor comprising the first dopant type;
    (ii) a base comprising the semiconductor material having a second dopant type;
    (iii) a base contact;
    (iv) a collector comprising the substantially intrinsic semiconductor material; and
    (v) an emitter; and
  c) a conductive interconnect coupling the pin photo diode and the heterojunction bipolar transistor.

23. An optoelectronic device comprising a pin photo diode, the pin photo diode comprising:
  a) a base structure;
  b) a base contact comprising a portion at least partially forming an opening, the portion having an edge facing an interior of the opening;
  c) a patterned implant subcollector within one of: (1) a semi-insulating substrate; or (2) a semi-insulating layer, the patterned implant subcollector opposing the opening without extending substantially beyond the interior facing edge of the opening; and
  d) a collector between the base structure and the patterned implant subcollector.

24. The optoelectronic device of claim 23 wherein a peripheral portion of the collector layer extends onto the one of the semi-insulating substrate or the semi-insulating layer beyond the patterned implant subcollector.

25. The optoelectronic device of claim 24 wherein a peripheral portion of the collector layer extends over the one of the semi-insulating substrate or the semi-insulating layer beyond the patterned implant subcollector.

26. The optoelectronic device of claim 24 wherein the one of the semi-insulating substrate or the semi-insulating layer comprises a group III-V compound.

27. The optoelectronic device of claim 26 wherein the one of the semi-insulating substrate or the semi-insulating layer comprises GaAs.

28. The optoelectronic device of claim 26 wherein the one of the semi-insulating substrate or the semi-insulating layer comprises InP.

29. The optoelectronic device of claim 28 wherein the one of the semi-insulating substrate or the semi-insulating layer comprises InP:Fe.

30. The optoelectronic device of claim 28 wherein the patterned implant subcollector comprises at least one of the group consisting of ions of: (a) Si; (b) Si/Se; or (c) Si/P.

31. The optoelectronic device of claim 23 wherein the patterned implant subcollector comprises:
  a) a first portion having a generally circular outer periphery not extending laterally beyond the interior facing edge of the base contact;
  b) a subcollector contact portion located beyond the base contact; and
  c) an elongated strip portion coupling the first portion and the subcollector contact portion, the elongated strip extending in a radial direction between the first portion and the subcollector contact portion.

32. The optoelectronic device of claim 23 further comprising a transistor coupled to the pin photo diode.

33. The optoelectronic device of claim 32 wherein the transistor is a heterojunction bipolar transistor, the heterojunction bipolar transistor comprising a patterned implant subcollector region located within the one of the semi-insulating substrate or the semi-insulating layer.

34. The optoelectronic device of claim 32 further comprising a field effect type transistor.

35. An optoelectronic device comprising a pin photo diode, the pin photo diode comprising:
   a) a patterned implant subcollector located within a semi-insulating material region, the patterned implant subcollector having an outer periphery;
   b) a base structure;
   c) a collector between the base structure and the patterned implant subcollector; and
   d) a base contact comprising a portion at least partially surrounding an opening, the base contact opposing the patterned implant subcollector such that the portion at least partially surrounding the opening is substantially nonoverlapping with the outer periphery of the subcollector.

36. The optoelectronic device of claim 35 wherein a peripheral portion of the collector layer extends onto the one of the semi-insulating substrate or the semi-insulating layer beyond the outer periphery of the patterned implant subcollector.

37. The optoelectronic device of claim 36 wherein a peripheral portion of the collector layer extends over the one of the semi-insulating substrate or the semi-insulating layer beyond the outer periphery of the patterned implant subcollector.

38. The optoelectronic device of claim 36 wherein the one of the semi-insulating substrate or the semi-insulating layer comprises a group III-V compound.

39. The optoelectronic device of claim 38 wherein the one of the semi-insulating substrate or the semi-insulating layer comprises GaAs.

40. The optoelectronic device of claim 38 wherein the one of the semi-insulating substrate or the semi-insulating layer comprises InP.

41. The optoelectronic device of claim 40 wherein the patterned implant subcollector comprises at least one of the group consisting of ions of: (a) Si; (b) Si/Se; or (c) Si/P.

42. The optoelectronic device of claim 35 wherein the patterned implant subcollector comprises:
   a) a first portion having a generally circular outer periphery not extending laterally beyond the interior facing edge of the base contact;
   b) a subcollector contact portion located beyond the base contact; and
   c) an elongated strip portion coupling the first portion and the subcollector contact portion, the elongated strip extending in a radial direction between the first portion and the subcollector contact portion.

43. The optoelectronic device of claim 35 further comprising a transistor coupled to the pin photo diode.

44. The optoelectronic device of claim 43 wherein the transistor is a heterojunction bipolar transistor, the heterojunction bipolar transistor comprising a patterned implant subcollector region located within the one of the semi-insulating substrate or the semi-insulating layer.

45. The optoelectronic device of claim 43 wherein the transistor is a field effect type transistor.

* * * * *